United States Patent
Choi et al.

(10) Patent No.: US 10,203,531 B2
(45) Date of Patent: Feb. 12, 2019

(54) VARIABLE SIZE DISPLAY SCREEN AND DISPLAY DEVICE INCLUDING THE SAME

(71) Applicant: Samsung Display Co. Ltd., Yongin-si, Gyeonggi-do (KR)

(72) Inventors: Jin Hwan Choi, Seoul (KR); Jeong Ho Kim, Seoul (KR); Hyun Woo Koo, Hwaseong-si (KR); Min Sung Kim, Hwaseong-si (KR); Tae Woong Kim, Seongnam-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 15/845,248

(22) Filed: Dec. 18, 2017

(65) Prior Publication Data

US 2018/0341142 A1 Nov. 29, 2018

(30) Foreign Application Priority Data

May 29, 2017 (KR) ........................ 10-2017-0066307

(51) Int. Cl.
*G02F 1/1333* (2006.01)
*G06F 1/16* (2006.01)
*H01L 51/50* (2006.01)
*H01L 27/32* (2006.01)

(52) U.S. Cl.
CPC ...... *G02F 1/133305* (2013.01); *G06F 1/1601* (2013.01); *G06F 1/1643* (2013.01); *G06F 1/1652* (2013.01); *H01L 27/322* (2013.01); *H01L 27/3218* (2013.01); *H01L 27/3246* (2013.01); *H01L 51/5044* (2013.01)

(58) Field of Classification Search
USPC .................................. 361/754, 752
See application file for complete search history.

(56) References Cited

U.S. PATENT DOCUMENTS 6,691,441 B1 * 2/2004 Crivelli .................... G09F 11/18
                                                              40/467
2016/0238751 A1 * 8/2016 Kanno ................. G02B 5/0268

FOREIGN PATENT DOCUMENTS

| KR | 1020140124095 A | 10/2014 |
| KR | 101570869 B1 | 11/2015 |
| KR | 1020160057046 A | 5/2016 |
| KR | 1020160087457 A | 7/2016 |

* cited by examiner

*Primary Examiner* — Andargie M Aychillhum
(74) *Attorney, Agent, or Firm* — Cantor Colburn LLP

(57) ABSTRACT

A display device includes: a display panel which displays an image with light; a cover window disposed on the display panel to form an outer display surface of the display device; a housing into which and out from the display panel and the cover window are together moved; and within the housing: a winding roller around which the display panel is wound and unwound within the housing, a first end of the display panel being connected to the winding roller; and a sliding guide along which the cover window slides to be bent within the housing, the sliding guide disposed outside the winding roller.

19 Claims, 14 Drawing Sheets

VARIABLE SIZE DISPLAY SCREEN AND DISPLAY DEVICE INCLUDING THE SAME

This application claims priority to Korean Patent Application No. 10-2017-0066307 filed on May 29, 2017, and all the benefits accruing therefrom under 35 U.S.C. § 119, the content of which in its entirety is herein incorporated by reference.

BACKGROUND

1. Field

The present disclosure relates to a rollable display device.

2. Description of the Related Art

Display devices become more and more important as multimedia technology evolves. Accordingly, a variety of types of display devices such as liquid-crystal display ("LCD") devices and organic light-emitting display ("OLED") devices are used.

Flexible display devices whose shape can be changed are being developed. Flexible display devices include a curved display device that can be curved with a specific curvature, a foldable display device that can be folded and unfolded, and a rollable display device that can be rolled for easy carrying.

Such flexible display devices are advantageous over existing display devices in that they are more useful to a user. However, flexible display devices have stability issues as a results of changing the shape thereof.

SUMMARY

One or more embodiment of the present disclosure provides a rollable display device with improved durability by reducing stress applied to a cover window thereof.

These and other features, embodiments and advantages of the present disclosure will become immediately apparent to those of ordinary skill in the art upon review of the Detailed Description and Claims to follow.

According to an embodiment of the present disclosure, there is provided a display device including: a display panel which displays an image with light; a cover window disposed on the display panel to form an outer display surface of the display device; a housing into which and out from the display panel and the cover window are together moved; and within the housing: a winding roller around which the display panel is wound and unwound within the housing, a first end of the display panel being connected to the winding roller; and a sliding guide along which the cover window slides to be bent within the housing, the sliding guide disposed outside the winding roller.

The housing may further include upper and lower plates spaced apart from each other and facing each other; and a connecting plate which is curved to connect the upper and lower plates with each other.

The cover window bent within the housing may dispose a bent portion of the cover window between the connecting plate and the sliding guide.

The sliding guide may include a bent portion which is curved along the connecting plate of the housing, a separator portion connected to a first end of the bent portion, the separator portion extended along the upper plate of the housing to be spaced apart therefrom, and a flat portion connected to a second end of the bent portion opposite to the first end thereof, the flat portion extended along the lower plate of the housing to be spaced apart therefrom.

A first end of the cover window may slide along the sliding guide to be bent within the housing, the bent first end being accommodated between the flat portion of the sliding guide and the lower plate.

The display device may further include: a stopper to which a distal end of the cover window opposite to the first end thereof and a distal end of the display panel opposite to the first end thereof are connected aligned with each other, the stopper being disposed outside the housing to restrict movement of the distal ends into the housing.

The upper plate of the housing may define a display window which exposes an inner area of the housing, and the cover window completely moved into the housing together with the display panel, may be exposed to outside the housing by the display window of the upper plate.

The display device may include: an adhesive layer attaching the cover window to the display panel, the adhesive layer extended from a distal end of the display panel opposite to the first end thereof to terminate between the distal end of the display panel and the sliding guide.

The display device may further include: an adhesive layer attaching the cover window to the display panel, the adhesive layer extended from the first end of the display panel to terminate at a distal end thereof opposite to the first end.

The display panel and the cover window may together move into or out of the housing along a first direction. The display device may further include an attachment member attaching the cover window to the display panel, the attachment member including: a first magnet and a second magnet respectively attached to the cover window at opposing sides of the cover window in a second direction crossing the first direction; and a first opposing body and a second opposing body attached to the display panel to face the first and second magnets, respectively, the first and second opposing bodies magnetically attractable to the first and second magnets.

The display panel may further include: a flexible printed circuit board disposed at the first end of the display panel, the winding roller may further include a groove into which the flexible printed circuit board is inserted to be accommodated in an inner space of the winding roller.

The display panel may include a first elastic layer and a second elastic layer which is disposed closer to the cover window than the first elastic layer; a display substrate disposed between the first elastic layer and the second elastic layer, the display substrate generating the image with the light; and a polarizing layer disposed between the display substrate and the second elastic layer.

According to another embodiment of the present disclosure, there is provided a display device including: a housing in which a winding roller and a sliding guide which is outside the winding roller are disposed; a display panel which displays an image with light, a first end of the display panel fixed to the winding roller; and a cover window disposed on the display panel to form an outer display surface of the display device, a first end of the cover window disposed outside the sliding guide to be supported thereby. Rotation of the winding roller fixed to the first end of the display panel: moves the display panel into and out of the housing, and slides the cover window along the sliding guide.

The display panel and the cover window may be attached together at a fixed attached area having a constant planar area, the display panel and the cover window may be removably attached together at a variable attached area having a variable planar area, the display panel maximally accommodated in the housing may define the variable planar area equal to zero, and the display panel maximally protruded out of the housing defines the variable planar area as a maximum area.

Rotation of the winding roller fixed to the first end of the display panel may slide the first end of the cover window along the sliding guide at the same time the first end of the display panel is wound around the winding roller.

The display device may include an adhesive layer attaching the cover window to the display panel, the adhesive layer disposed only in the fixed attached area.

According to one or more exemplary embodiment of the present disclosure, at least following effects can be achieved:

It is possible to reduce stress exerted on a cover window during bending thereof to thereby reduce or effectively prevent the cover window from being broken.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the present disclosure will become more apparent by describing in detail exemplary embodiments thereof with reference to the attached drawings, in which.

DETAILED DESCRIPTION

Figure 1:
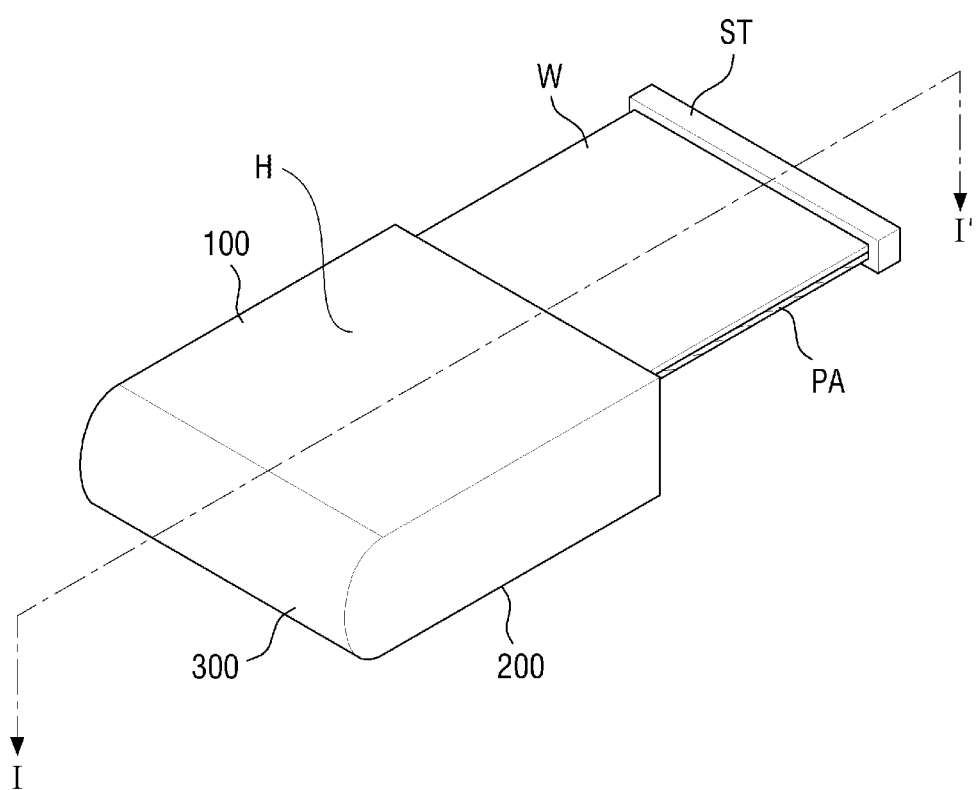
FIG. 1 is a perspective view of an exemplary embodiment of a display device according to the invention.

The features of the invention and methods for achieving the features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

A term describing a relationship between elements such as "on" that is used to designate that an element is on another element or located on a different layer or a layer, includes both a case where an element is located directly on another element or a layer with no intervening elements or layers therebetween and a case where an element is located on another element via another layer or still another element. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the attached drawings.

Figure 2:
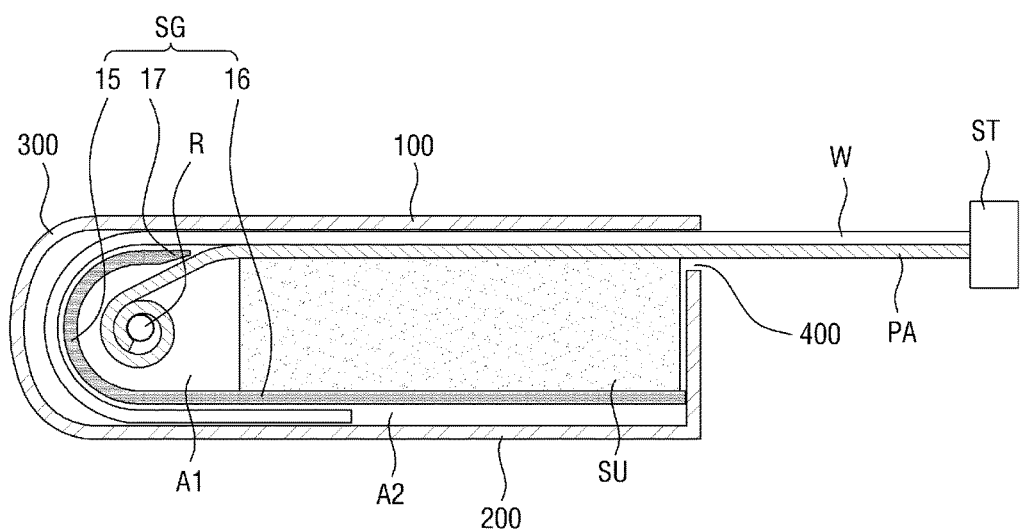
FIG. 2 is a cross-sectional view taken along line I-I' of FIG. 1.

FIG. 1 is a perspective view of an exemplary embodiment of a display device according to the invention. FIG. 2 is a cross-sectional view taken along line I-I' of FIG. 1.

Referring to FIGS. 1 and 2, a display device according to an exemplary embodiment of the present disclosure includes a housing H partitioned into a first area A1 and a second area A2 at least partially surrounding the first area A1, a display panel PA having an end fixed to a winding roller R accommodated in the first area A1, a cover window W accommodated in the second area A2 and at least partially covering the display panel PA, and a sliding guide SG disposed outside the winding roller R to support the cover window W.

The display device may be disposed in a plane defined by first and second directions which cross each other, such as being perpendicular to each other. A thickness of the display device is defined in a third direction crossing each of the first and second directions, such as being orthogonal thereto. For convenience of explanation, a vertical direction in FIG. 2 shows a thickness (third) direction of the display device while a horizontal direction in FIG. 2 shows a first direction.

The housing H may include or define an upper plate 100, a lower plate 200, a connecting plate 300 connecting the upper plate 100 to the lower plate 200, and an opening 400. The upper plate 100 and the lower plate 200 may have a flat surface shape and may be spaced apart from each other in the thickness direction of the display device to face each other. The inner space of the housing H defined by the plates thereof, to be described later, may be defined in proportion to the distance between the upper plate 100 and the lower plate 200 in the thickness direction.

The connecting plate 300 connecting the upper plate 100 with the lower plate 200 may be disposed at a first side of the upper plate 100 and the lower plate 200 in the first direction. The connecting plate 300 may connect the upper plate 100 with the lower plate 200 and may provide a closed side (e.g., having no opening) of the housing H including the upper plate 100 and the lower plate 200 spaced apart from each other.

In an exemplary embodiment, the connecting plate 300 may include a surface which is at least partially curved. That is, the connecting plate 300 may include a flat portion and a curved portion. The connecting plate 300 may guide the window W to be gradually bent within the housing H, in cooperation with the sliding guide SG to be described later.

The opening 400 may be disposed or formed at a second side of the upper plate 100 and the lower plate 200, opposite to the first side thereof and opposite to the connecting plate 300. The opening 400 may connect an outer space outside the display device to an inner space of the housing H. The display panel PA and/or the cover window W described later may be movable into and out of the housing H through the opening 400.

The inner space of the housing H may be partitioned by the upper plate 100, the lower plate 200 and the connecting plate 300. In the inner space, various elements of the display device to be described later are disposed. The inner space of the housing H may be partitioned into a plurality of areas.

In an exemplary embodiment, the inner space of the housing H may include a first area A1 and a second area A2. An inner side of the inner space is disposed further from the plates of the housing H, while an outer side of the inner space is disposed closer to the plates of the housing H. As shown in FIG. 2, the first area A1 may be defined at the inner side of the inner space of the housing H, while the second area A2 may be defined at the outer side of the inner space of the housing H. That is, the second area A2 may be partially surrounded by the first area A1.

It is to be noted that the first area A1 is not completely physically separated from the second area A2 but may be partially connected thereto. As will be described later, the display panel PA and the cover window W may be attached together in an area where the first area A1 and the second area A2 meet.

The winding roller R may be disposed in the first area A1 of the inner space of the housing H. The winding roller R may rotate clockwise or counterclockwise with respect to a single rotation shaft or axis. A detailed description on the relationship between the winding roller R and the display panel PA will be given later.

The display panel PA may be partially wound around the winding roller R. The display panel PA generates and displays an image to be displayed by the display device.

In an exemplary embodiment, the display panel PA may be a flexible display panel. That is, the display panel PA has flexibility such that portions thereof may be wound around the winding roller R in the form of a coil.

In an exemplary embodiment, the display panel PA may be a flexible display panel. The display panel PA may include or be made of a flexible material. The flexible material may be at least one selected from: polycarbonate ("PC"), polyethylene terephthalate ("PET"), polyethylene ("PE"), polypropylene ("PP"), polysulfone ("PSF"), polymethyl methacrylate ("PMMA"), triacetylcellulose ("TAC"), cyclo-olefin polymer ("COP"), and a cyclo-olefin copolymer ("COC"). It is to be noted that the above-listed materials are merely illustrative and are not limiting.

A first end of the display panel PA may be fixed to the winding roller R. As described above, the winding roller R may be rotated with respect to the single rotation shaft. In the exemplary embodiment shown in FIG. 2, when the winding roller R is rotated counterclockwise, the display panel PA is wound along the outer peripheral surface of the winding roller R. In addition, when the winding roller R is rotated clockwise, the display panel PA may be unwound from the winding roller R and be lengthened along the first direction.

It is to be understood that this is merely illustrative. In another exemplary embodiment, the display panel PA may be wound when the winding roller R rotates clockwise, while the display panel PA may be unwound when the winding roller R rotates counterclockwise.

The sliding guide SG may be disposed on or at a first side of the winding roller R, such as at the side of the winding roller R at which the connecting plate 300 is disposed. The sliding guide SG may be disposed between the first area A1 and the second area A2 of the inner space of the housing H. In other words, the sliding guide SG may at least partially separate the first area A1 and the second area A2 from each other.

The sliding guide SG may include or define a bent portion 15, a flat portion 16 and a separator portion 17. The bent portion 15 includes a curved surface at an inner side and an outer side of the sliding guide SG. The curved outer surface of the sliding guide SG may face an inner surface of the connecting plate 300. Between the bent portion 15 of the sliding guide SG and the connecting plate 300, the cover window W to be described later may be disposed.

Each of the bent portion 15 of the sliding guide SG and the connecting plate 300 has a curved portions defining curved inner and outer surfaces thereof, and thus, the cover window W may be bent at a gradual curve between the bent portion 15 and the connecting plate 300. As a result, a stress exerted on the cover window W can be reduced.

The separator portion 17 of the sliding guide SG may be connected to a first end of the bent portion 15. The cover window W and the display panel PA partially or removably attached together may be separated from each other in the vicinity of the separator portion 17. The separator portion 17 may be located between the cover window W and the display panel PA to guide the separation thereof.

To this end, the separator portion 17 the sliding guide SG may have a tapered tip at an end thereof. Although FIG. 2 illustrates that the separator portion 17 is spaced apart from the cover window W and the display panel PA, but the invention is not limited thereto. In another exemplary embodiment, the separator portion 17 of the sliding guide SG may be in contact with the cover window W and/or the display panel PA during the operation of the display device.

The flat portion 16 of the sliding guide SG may be connected to a second end of the bent portion 15 opposite to the first end thereof.

The flat portion 16 of the sliding guide SG extends from the second end of the bent portion 15 and may face the lower plate 200 of the housing H. The lower plate 200 of the housing H may be spaced apart from the flat portion 16 by a predetermined distance. That is, a space is formed between the housing H and the lower plate 200, and a portion of the cover window W described later may be accommodated in the space.

A supporting unit (member) SU may be disposed on or at a second side of the winding roller R opposite to the first side thereof. The supporting unit SU may be disposed at the side of the winding roller R opposite to that which the connecting plate 300 is disposed. The inner space of the housing H may effectively be filled with the supporting unit SU, since the supporting unit SU occupies a majority of the inner space. The supporting unit SU may support a portion of the display panel PA which is unwound from the winding roller R to guide the display panel PA to be lengthened pas the winding roller R and/or the sliding guide SG.

In an exemplary embodiment, the supporting unit SU may be disposed on the flat portion 16 of the sliding guide SG.

Although the supporting unit SU is illustrated in the drawings as an element for occupying a majority of the inner space of the housing H for convenience of illustration, this is merely illustrative.

In another exemplary embodiment, in order to support portions of the display panel PA and the cover window W outside of the sliding guide SG, the inner space of the housing H may be essentially filled with a single element (SU in FIG. 2) or a plurality of elements. In an embodiment, the single element feature in FIG. 2 labeled as "SU" may be a collection of individual elements together functioning to support the portions of the display panel PA and the cover window W outside of the sliding guide SG.

In yet another exemplary embodiment, the supporting unit SU and the sliding guide SG in the housing H may be integrally formed. That is, one of the supporting unit SU and the sliding guide SG may be extended to define a portion thereof as the other one of the supporting unit SG and the sliding guide SG.

The cover window W may be disposed on the display panel PA. The cover window W may cover at least a part of the display panel PA. The cover window W may form an outer surface of the display device, such as at a viewing side thereof. The cover window W may form a display screen of the display device. The display screen has a variable size based on a rolling and unrolling of the cover window W and the display panel PA within the housing H. The image generated and displayed by the display panel PA may be transmitted or viewable through the cover window W. The cover window W may cover or overlap a display area of the display panel PA at which the image is displayed. The cover window W may also cover or overlap a non-display area of the display panel PA at which the image is not displayed.

The cover window W may include or be made of a flexible material. In an embodiment, for example, the cover window W may include or be made of flexible plastic.

Although FIG. 2 illustrates the cover window W composed of a single layer in cross-section, this is merely illustrative. That is, the cover window W may have a structure in which one or more polymer layers are stacked on one another to form a collective cover window W.

The cover window W may be accommodated in the second area A2 of the inner space of the housing H. Specifically, the cover window W may be bent at least once to be accommodated in the inner space of the housing H at opposing sides of the display panel PA.

Further, the cover window W may slidably disposed along the sliding guide SG and may move into and out of the housing H, to be respectively disposed inside of and outside of the housing H. The movement of the cover window W will be described later in detail.

An edge of the distal end of the cover window W and an edge of the distal end of the display panel PA may be aligned with each other. However, an end of the cover window W opposite to the distal end thereof and an end of the display panel PA opposite to the distal end thereof are not aligned with each other and are accommodated in different areas of the inner space of the housing H. Specifically, among the unaligned ends thereof, the end of the cover window W is disposed in the second area A2 of the inner space, and the end of the display panel PA is disposed in the first area A1 of the inner space and fixed to the winding roller R.

A stopper ST may be disposed outside the housing H, specifically, outside the opening 400. The stopper ST may restrict movement of the distal ends of the cover window W and the display panel PA into the inner space of the housing H.

The stopper ST may have a bar-like shape lengthwise extending in a longitudinal direction, such as in a second direction in FIG. 1. The stopper ST may fix the aligned distal ends of the display panel PA aligned with each other outside the housing H.

A first direction length and a third direction thickness of the stopper ST may be larger than those dimensions of the opening 400. Accordingly, while the cover window W and the display panel PA are moving into and out of the housing H, the stopper ST is held outside the housing H by the opening 400, such that the stopper ST and the distal ends of the cover window W and the display panel PA cannot move into the inner space of the housing H. That is, the stopper ST may restrict the movement of the cover window W and the display panel PA into the inner space of the housing H.

Hereinafter, the operation of the display device according to an exemplary embodiment of the present disclosure will be described in detail with reference to FIGS. 3 and 4.

Figure 3:
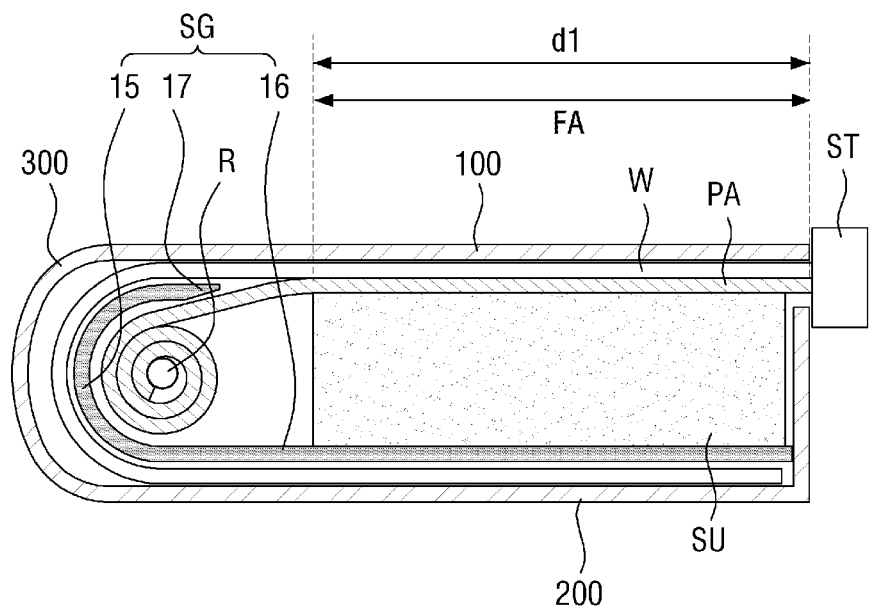
FIG. 3 is a cross-sectional view illustrating an exemplary embodiment of an operation state of the display device of FIG. 1 according to the invention.
Figure 4:
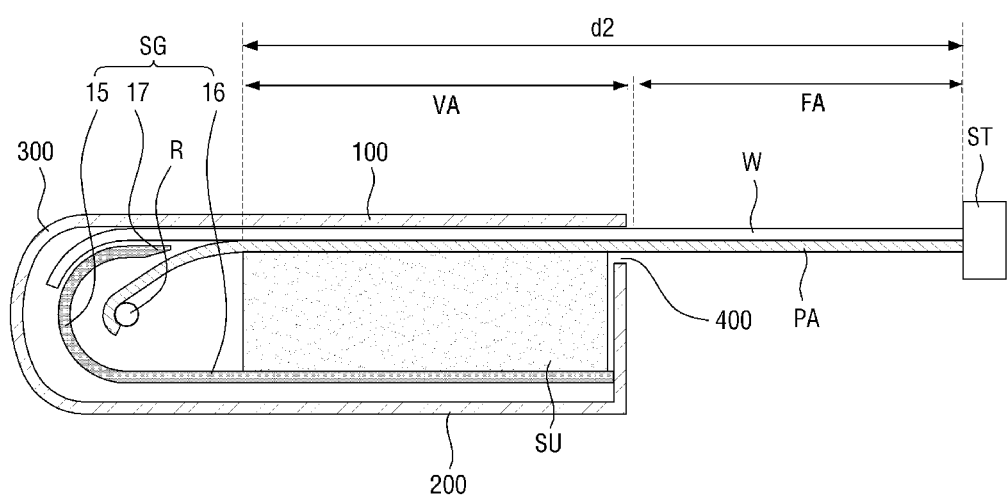
FIG. 4 is a cross-sectional view illustrating another operation state of the display device of FIG. 1 according to the invention.

FIGS. 3 and 4 are cross-sectional views of exemplary embodiments of operation states of the display device of FIGS. 1 and 2 according to the invention.

For convenience of illustration, "initial state" and "spread-out state" are defined herein. In the initial state, a display screen of the display device may be completely or fulling retracted into the housing thereof. A size of the display screen may be minimum in the initial state. In contrast, in the spread-out state, a display screen of the display device is not completely retracted into the housing thereof, and a portion of the display screen is protruded from the housing. That is, in the spread-out state, a size of the display screen may be greater than the minimum size thereof, up to a maximum size of the display screen.

In the initial state, the display panel PA and the cover window W do not protrude from the housing H to outside thereof, as shown in FIG. 3. In this state, the stopper ST may be in contact with the upper plate 100 and the opening 400, and a display screen including the display area of the display panel PA is not visible from outside the housing.

In the initial state, the display panel PA may be at least partially wound around the winding roller R.

The cover window W may be bent along the bent portion 15 of the sliding guide SG. That is, the cover window W may be accommodated in a "U-shape" space that is defined along the curved inner walls of the housing H.

In other words, the distal end of the cover window W may be fixed to the stopper ST, and the end of the cover window W opposite to the distal end thereof may be disposed in the inner space between the flat portion 16 of the sliding guide SG and the lower plate 200 of the housing H.

In the initial state, the display panel PA and the cover window W may be partially attached together. For convenience of illustration, an area at which portions of the display panel PA and the cover window W are fixedly attached to each other is referred to as "fixed attached area FA." That is, the fixed attached area FA may be defined as a total area where the display panel PA and the cover window W are attached together. Since the display panel PA and the cover window W are fixedly attached to each other at the fixed attached area FA, a total area of the fixed attached area FA is constant in both the initial state and the spread-out state.

The display panel PA and the cover window W may be brought into contact with and/or attached to each other in the fixed attached area FA. The fixed attached area FA may be extended from the distal ends of the display panel PA and the cover window W fixed to the stopper T to include the area where the display panel PA overlaps with the supporting unit SU in the housing H. However, it is to be understood that this is merely illustrative. In another exemplary embodiment, the fixed attached area FA may extend to the vicinity of the separator portion 17.

In the first direction, the width of the fixed attached area FA may be equal to a first distance d1. A total planar area of the fixed attached area FA may be a product of the first distance d1 defined in the first direction, and a distance in the second direction at the first distance d1. That is, a total planar area of contacted and/or attached area of the display panel PA and the cover window W in the initial state may be equal to the total planar area of the fixed attached area FA. That is, the first distance d1 may be the contact width in the first direction when the contacted and/or attached area of the display panel PA and the cover window W is minimum.

The spread-out state will be defined with reference to FIG. 4. In the spread-out state, the display panel PA and the cover window W may maximally protrude from the housing H to outside thereof. For convenience of illustration, an area at which portions of the display panel PA and the cover window W are detachably contacted to each other is referred to as a variable attached area VA is defined herein. A width in the first direction, and therefore a total planar area, of the variable attached area varies as the display panel PA and the cover window W are contacted with each other as the display device switches from the initial state to the spread-out state and vice-versa. In other words, a first-direction width or a total planar area of the variable attached area VA in the initial state is "0" (e.g., minimum) and the first-direction width or the total planar area of the variable attached area VA in the spread-out state become the maximum.

The total planar area of the contacted and/or attached area in the spread-out state may be equal to a sum of the total area of the fixed attached area FA and the maximum planar area of the variable attached area VA. That is, the total first-direction width of the contacted and/or attached area in the spread-out state is equal to the second distance d2. The width of the variable attached area VA would have a value obtained by subtracting the first distance d1 from the second distance d2.

The display device may operate between the initial state and the spread-out state thereof.

More specifically, the display panel PA wound around the winding roller R may be gradually unwound as the display device switches from the initial state to the spread-out state. In accordance with this, the cover window W together with the display panel PA slides along the sliding guide SG, such that the cover window W overlaps the display panel PA that moves out of the housing H. As moving together, the cover window W and the display panel PA maybe moved at a same time. Since the distal end of the display panel PA and the distal end of the cover window W are fixed by the stopper ST, the distal end of the display panel PA and the distal end of the cover window W may move in the same path.

It is to be noted that the end of the display panel PA opposite to the distal end thereof and the end of the cover window W opposite to the distal end thereof may move in different paths.

That is, when the display device transitions from the initial state to the spread-out state, the end of the cover window W opposite to the distal end thereof slides in the space between the lower plate 200 of the housing H and the flat portion 16 of the sliding guide SG to move along the bent portion 15. At the same time, the end of the display panel PA opposite to the distal end thereof is fixed to the winding roller R to be rotated therearound.

In addition, in cross-section, the curvature radius of the bent portion of the cover window W is larger than the curvature radius of the bent portion of the display panel PA. Therefore, since the cover window W and the display panel PA are bent along different paths within the housing H, the stress applied to the cover window W is smaller than the stress applied to the display panel PA.

Although both the cover window W and the display panel PA may have flexibility, the cover window W is required to have a higher hardness and wear resistance than those of the display panel PA. That is, the cover window W is more vulnerable to the stress generated when the display device is bent, as compared with the display panel PA.

As described above, by moving the cover window W separately from the display panel PA, that is, by sliding the cover window W instead of winding it around the roller, the stress applied to the cover window W is mitigated, such that it is possible to reduce or effectively prevent the cover window W from being damaged by the stress.

Hereinafter, the stress applied to the display panel PA at the time of rolling the display device will be described with reference to FIG. 5.

Figure 5:
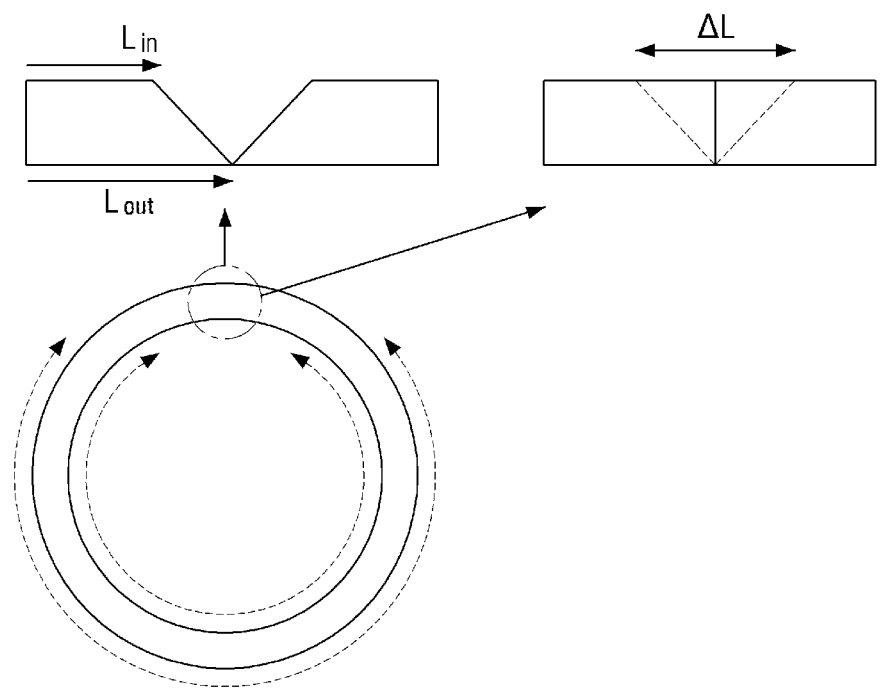
FIG. 5 is a view schematically showing a length deformation of the display panel of a display device.

FIG. 5 is a view schematically showing a length deformation of the display panel PA in a display device.

Referring to FIG. 5, a change in the length ΔL by rolling has a relationship expressed by Equation 1 below:

$$L_{in}=2\pi r+2\pi(r+d)+2\pi(r+2d)+ \ldots +2\pi[r+(n-1)d]$$

$$L_{out}=2\pi(r+d)+2\pi(r+2d)+ \ldots +2\pi[r+(n-1)d]+2\pi(r+nd)$$

$$\Delta L=L_{out}-L_{in}=2\pi nd \qquad \text{<Equation 1>}$$

where 'r' denotes the radius at the initial rolling, 'd' denotes the thickness of the display panel, 'n' denotes the number times of rolling, $L_{in}$ denotes the length of the inner side of the display panel, and $L_{out}$ denotes the length of the outer side of the display panel.

In addition, in a rollable display device, the display panel PA can be restored to an initial state thereof after rolling. If the value of the maximum length deformation (ΔL elastic) in an elastic region is greater or smaller than the length deformation ΔL, the display panel PA can be restored to the initial state thereof.

This can be expressed by Equation 2 below:

$$\Delta L_{elastic} = \frac{\sigma}{E}L_0 \qquad \text{<Equation 2>}$$

$$\frac{\sigma}{E}L_0 \geq 2\pi nd$$

where $\Delta L_{elastic}$ denotes the maximum length deformation in the elastic region, $\Delta L_0$ denotes length deformation, 'E' denotes Young's Modulus, and 'σ' denotes Yield strength.

The resilience speed after rolling is determined depending on the properties of the display panel PA. The resilience time can be derived by Equation 3 below:

$$\frac{2\pi nd \cdot E}{L_0} = \frac{F}{A} = \frac{ma}{A} = \frac{m}{A}\left(\frac{S}{t^2}\right) \qquad \text{<Equation 3>}$$

$$t = \sqrt{\frac{m \cdot S \cdot L_0}{E \cdot 2\pi nd \cdot A}}$$

$$t \propto \sqrt{\frac{m}{E}}$$

$$t = \sqrt{\frac{L_0 \cdot m}{E \cdot A}} \quad (m = V \times i = L_0 \times A \times i)$$

$$t = \sqrt{\frac{L_0^2 \cdot i}{E}}$$

where 'F' denotes resilience force, 'm' denotes mass, 'a' denotes acceleration, "S" denotes moving distance, 't' denotes resilience time, 'A' denotes area, "V" denotes volume, and 'i' denotes density.

Hereinafter, exemplary embodiments of a display device according to the invention will be described. In the following description, the same or similar elements will be denoted by the same or similar reference numerals, and redundant descriptions will be omitted or briefly described.

Figure 6:
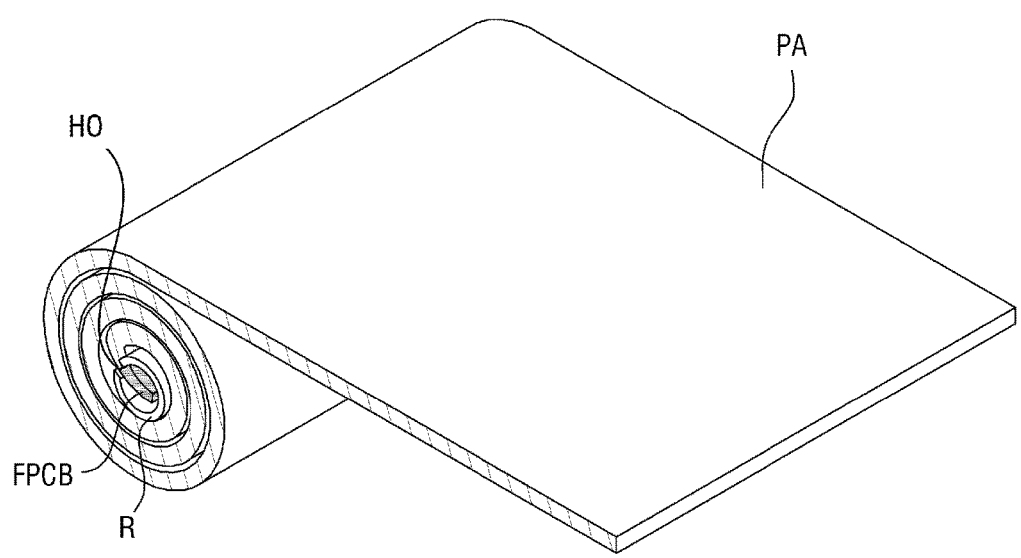
FIG. 6 is a perspective view of a modified exemplary embodiment of a display device according to the invention.

FIG. 6 is a perspective view of a modified exemplary embodiment of a display device according to the invention.

Referring to FIG. 6, a flexible printed circuit board FPCB is disposed on one side of a display panel PA. The flexible printed circuit board FPCB may be attached to the end of the display panel PA opposite to the distal end thereof.

The flexible printed circuit board FPCB may be disposed on one side of the display panel PA. The flexible printed circuit board FPCB may provide a control, driving or power signal for controlling the display panel PA to generate and display an image.

In an exemplary embodiment, the flexible printed circuit board FPCB may include a film layer having flexibility. Also, in an exemplary embodiment, a drive integrated circuit ("IC") (not shown) may be mounted on the flexible printed circuit board FPCB. It is to be understood that the drive IC may be disposed at a different location within the display device.

The winding roller R may have a groove HO defined or formed therein which extends in the longitudinal direction (e.g., a length direction of the winding roller R, such as the second direction). A portion of the flexible printed circuit board FPCB may be inserted through the groove HO and accommodated at an inner space of the winding roller R.

When the portion of the flexible printed circuit board FPCB is accommodated within the winding roller R, a separate space for accommodating the flexible printed circuit board FPCB within the housing H or the display device is omitted. As a result, an overall size of the display device can be reduced.

Figure 7:
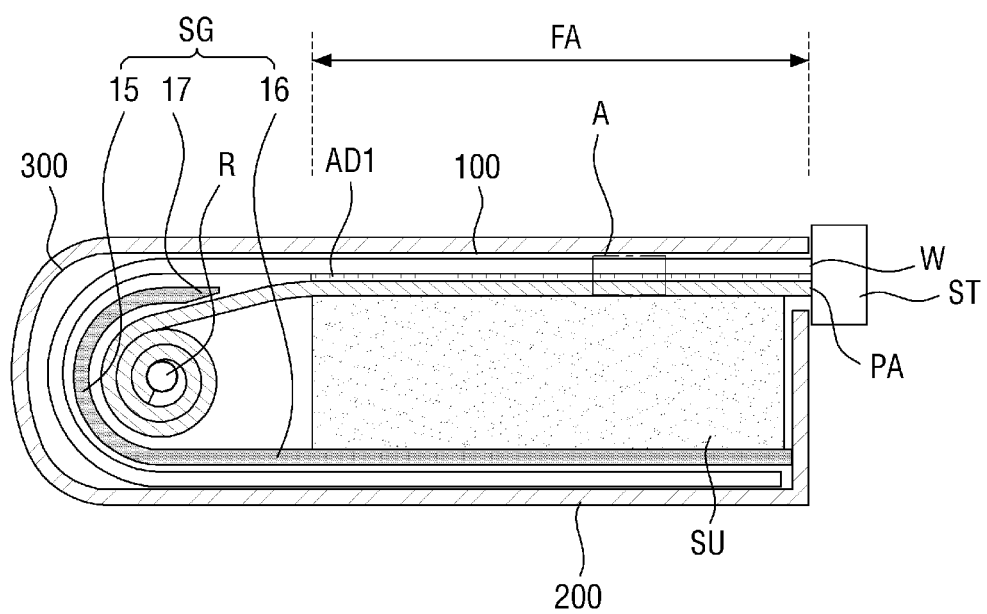
FIG. 7 is a cross-sectional view of another modified exemplary embodiment of a display device according to the invention.

FIG. 7 is a cross-sectional view of another modified exemplary embodiment of a display device according to the invention.

Referring to FIG. 7, the display device according to this exemplary embodiment of the present disclosure is different from that of FIG. 2 in that the former includes a first adhesive layer AD1 disposed in a fixed attached area FA at which a display panel PA and a cover window W are fixedly attached to each other. FIG. 7 shows an initial state of the display device.

In an exemplary embodiment, the first adhesive layer AD1 may be disposed between the display panel PA and the cover window W, to fixedly attach these elements to each other. The first adhesive layer AD1 may extend from distal ends of the display panel PA and the cover window W to terminate at a boundary of the fixed arranged area FA.

In an exemplary embodiment, the first adhesive layer AD1 may include optical clear adhesive ("OCA") and/or pressure sensitive adhesive ("PSA").

The first adhesive layer AD1 may be disposed in the fixed attached area FA. The first adhesive layer AD1 attaches the cover window W to the display panel PA. The cover window W and the display panel PA disposed in the fixed attached area FA are neither bent nor rolled during the transition from the initial state to the spread-out state. In other words, the cover window W and the display panel PA in the fixed attached area FA remain essentially flat or parallel to each other in both the initial state to the spread-out state. Accordingly, by disposing the first adhesive layer AD1 in the fixed arranged area FA to thereby fixedly attach the cover window W to the display panel PA, the display device can be operated or driven more stably.

Figure 8:
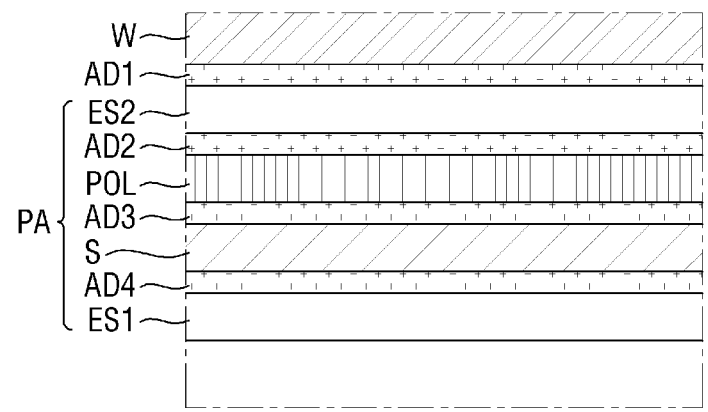
FIG. 8 is an enlarged cross-sectional view of portion A of FIG. 7.

FIG. 8 is an enlarged cross-sectional view of portion A of FIG. 7. Referring to FIG. 8, the display panel PA may have a structure in which a number of layers are stacked on one another.

Specifically, the display panel PA may include a first elastic layer ES1, a fourth adhesive layer AD4, a display substrate S, a third adhesive layer AD3, a polarizing layer POL, a second adhesive layer AD2, and a second elastic layer ES2.

The first elastic layer ES1 and the second elastic layer ES2 have elasticity and may serve to protect the display substrate S that is wound around the winding roller R.

The display substrate S is a substrate which includes various components for displaying an image with light. The display substrate S may include a plurality of pixels at which an image is generated and displayed with the light. In an exemplary embodiment, the display substrate S may include, but is not limited to, an organic light-emitting display device. The display substrate S may include various signal lines through which control and driving signals are transmitted to the pixels, a light generating or light controlling element such as an optical control medium (e.g., organic light emitting diode, liquid crystal layer, etc.), electrodes which are connected to the signal lines and control operation of the light generating/controlling element, and the like.

The polarizing layer POL may reduce or effectively prevent reflection of external light to the display device such as when the display substrate S is used in an organic light-emitting display device.

The second adhesive layer AD2, the third adhesive layer AD3 and the fourth adhesive layer AD4 may attach various layers to each other among the display substrate S, the polarizing layer POL, the first elastic layer ES1 and the second elastic layer ES2. In an exemplary embodiment, the second adhesive layer AD2, the third adhesive layer AD3 and the fourth adhesive layer AD4 may include or be made of the same material as the first adhesive layer AD1.

The first adhesive layer AD1 may be disposed on the second elastic body ES2, and a cover window W may be disposed on the first adhesive layer AD1. Specifically, the display panel PA and the cover window W are attached together in the fixed attached area FA, as described above. However, in the initial state, the display panel PA and the cover window W are spaced apart from each other in an area of the display device other than the fixed attached area FA. In this case, the first adhesive layer AD1 is omitted as described above with respect to FIG. 7. That is, a cross-section of a portion of FIG. 7 at an area other than the fixed attached area FA, may be similar to that shown in FIG. 8, except that the first adhesive layer AD1 is omitted from between the second elastic body ES2 of the display panel PA and the cover window W.

Figure 9:
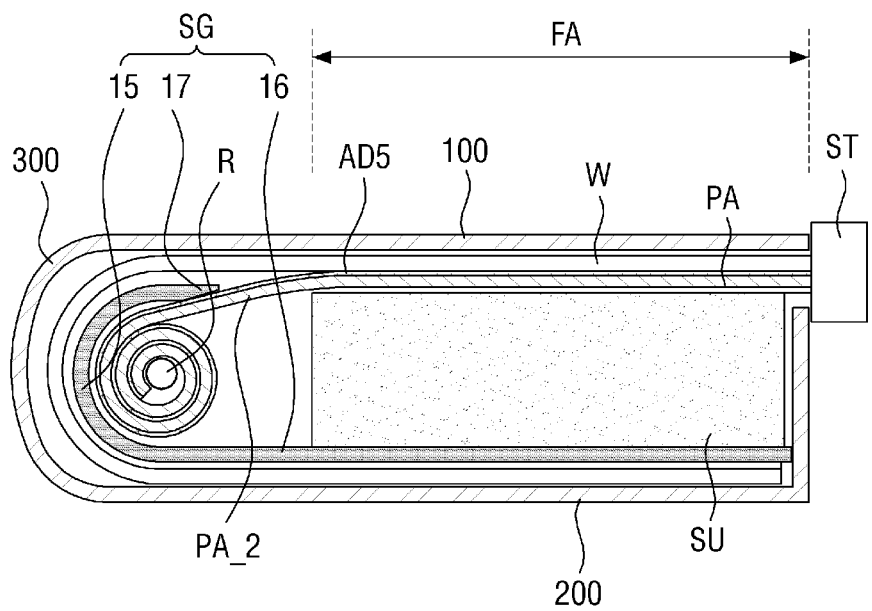
FIG. 9 is a cross-sectional view of still another modified exemplary embodiment of a display device according to the invention.
Figure 10:
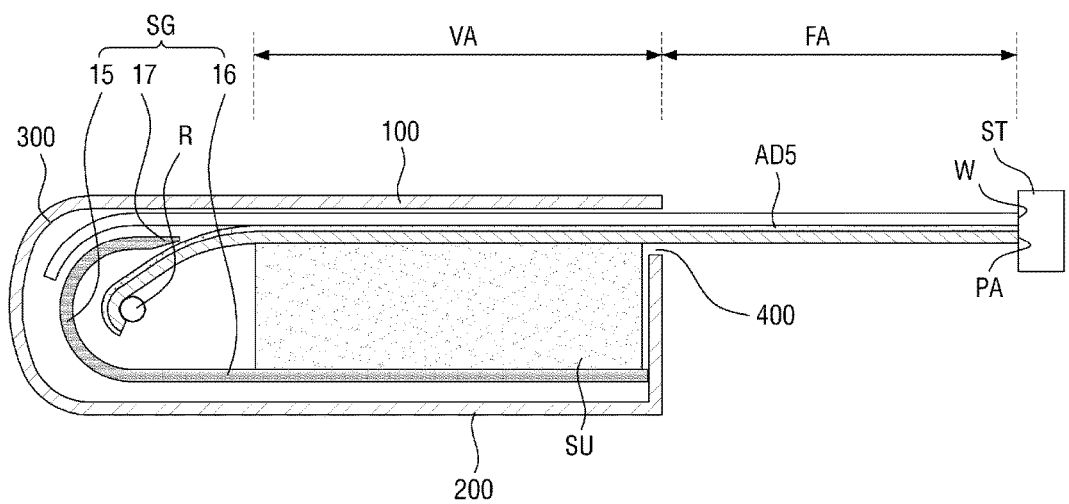
FIG. 10 is a cross-sectional view of an exemplary embodiment of an operation state of the display device of FIG. 9 according to the invention.

FIGS. 9 and 10 are cross-sectional views of still another modified exemplary embodiment of a display device according to the invention.

Referring to FIGS. 9 and 10, the display device according to another exemplary embodiment of the present disclosure is different from that of FIG. 7 in that a fifth adhesive layer AD5 is disposed or formed on an entirety of the display panel PA.

In an exemplary embodiment, the fifth adhesive layer AD5 may be disposed or formed on the entirety of the display panel PA, such as from the distal end thereof to the end thereof opposite to the distal end (in the first direction), and across dimension of the display panel PA in the second direction. In an embodiment, the fifth adhesive layer AD5 may be formed on a partial dimension of the display panel PA in the second direction.

In this case, in the initial state shown in FIG. 9, the cover window W and the display panel PA are attached together only in the fixed attached area FA, by the fifth adhesive AD5. As the display device switches from the initial state to the spread-out state (FIG. 10), the area of the variable attached area VA increases. That is, as the display device switches from the initial state to the spread-out state, the area where the cover window W comes into attachment or contact with the display panel PA increases.

When the display device is shifted from the spread-out state to the initial state, the cover window W and the display panel PA attached together at the variable attached area VA are again separated from each other.

That is, the cover window W and the display panel PA remain attached in the fixed attached area FA but are attachable to and detachable from each other repeatedly in the variable attached area VA.

Figure 11:
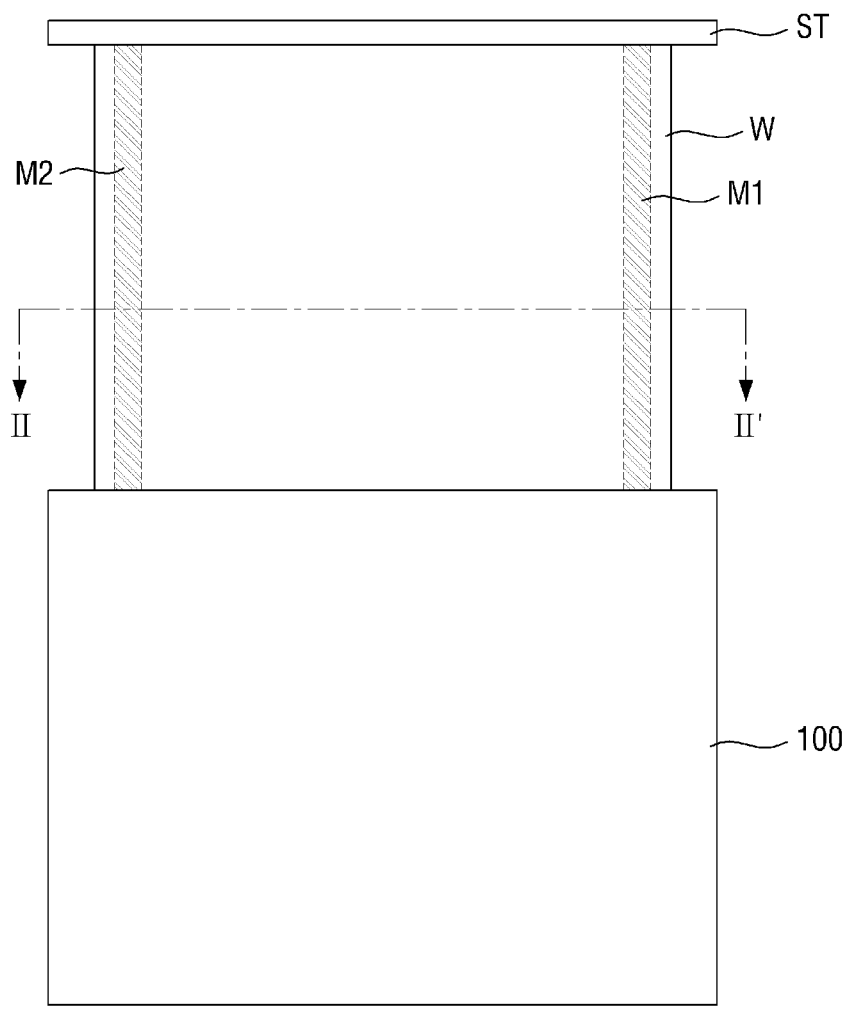
FIG. 11 is a top plan view of yet another modified exemplary embodiment of a display device according to the invention.
Figure 12:
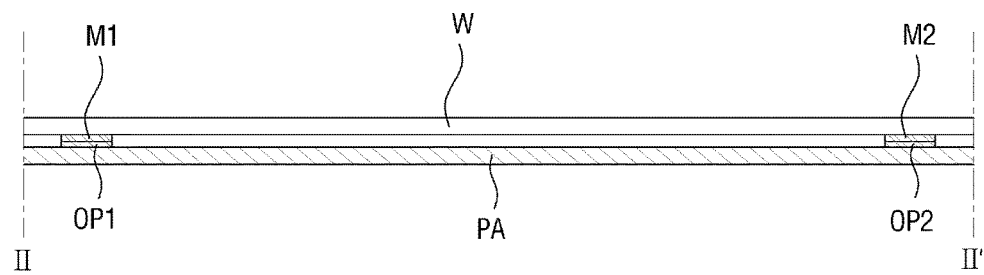
FIG. 12 is a cross-sectional view taken along line II-II' of FIG. 11.

FIG. 11 is a top plan view of yet another modified exemplary embodiment of a display device according to the invention. FIG. 12 is a cross-sectional view taken along line II-II' of FIG. 11.

Referring to FIGS. 11 and 12, the display device according to this exemplary embodiment of the present disclosure is different from that of FIG. 2 in that the former further includes first and second magnets M1 and M2 disposed or formed on each of opposing sides of the display panel PA and the cover window W in the second direction. The first and second magnets M1 and M2 may be fixedly attached to the cover window W.

In an exemplary embodiment, the display panel PA and the cover window W may be attachable to and separable from each other by the first magnet M1 and the second magnet M2. The first magnet M1 and the second magnet M2 may include a magnetic material.

The first magnet M1 and the second magnet M2 disposed or formed under the cover window W may have a bar shape and may lengthwise extend in the first direction along a side sides of the cover window W, respectively. Although the first magnet M1 and the second magnet M2 shown in FIG. 11 are extended continuously in the first direction, this is merely illustrative. In another exemplary embodiment, the first magnet M1 and/or the second magnet M2 may be extended discontinuously or discretely in the second direction. That is, the first magnet M1 and/or the second magnet M2 generally indicated in FIGS. 11 and 12 may respectively include a collection of individual magnets arranged in the first direction at a respective side of the cover window W.

Referring to FIG. 12, in a thickness direction, a first opposing body (member) OP1 and a second opposing body OP2 may be disposed on the display panel PA such that they face the first magnet M1 and the second magnet M2, respectively. The In an exemplary embodiment, the first opposing body OP1 and the second opposing body OP2 may include a magnetic substance (material) or a metal (material). The first opposing body OP1 and the second opposing body OP2 may be magnetically attracted to the first magnet M1 and the second magnet M2, respectively.

The first magnet M1 and/or the second magnet M2 may be disposed or formed only in the fixed attached area FA as shown in FIG. 7. Alternatively, the first magnet M1 and/or the second magnet M2 may be disposed or formed at an entire area of the cover window W and/or the display panel PA, such as is shown for the fifth adhesive AD5 in FIG. 9. As an entire area, the first magnet M1 and/or the second magnet M2 may be extended along an entire of the first direction of the cover window W and/or display panel PA, while being extended along a portion or an entire of the second direction.

Figure 13:
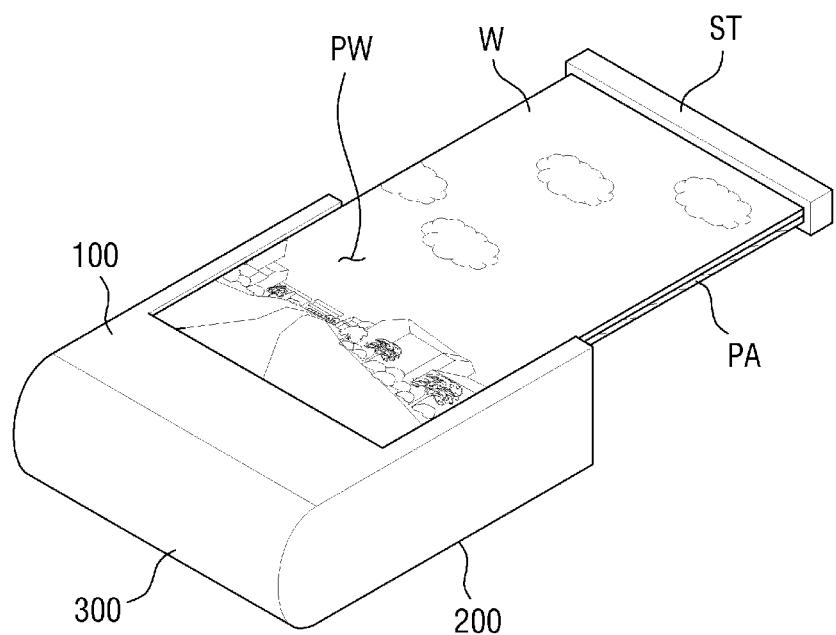
FIG. 13 is a perspective view of another exemplary a display device according to the invention.
Figure 14:
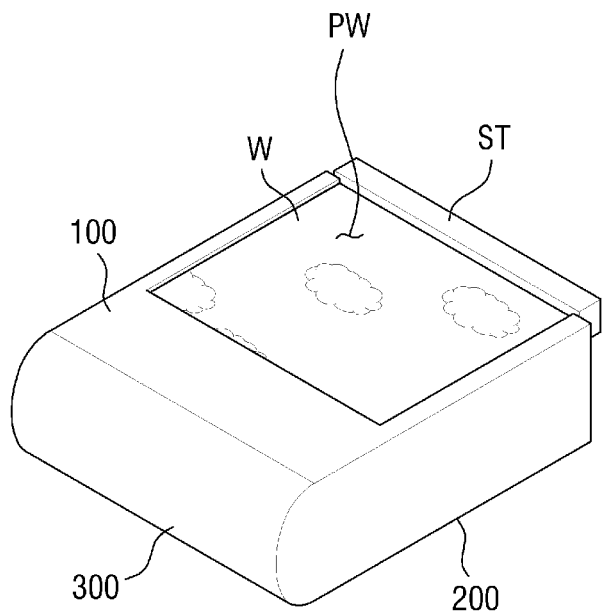
FIG. 14 is a perspective view of an exemplary embodiment of an operation state of the display device of FIG. 13 according to the invention.

FIG. 13 is a perspective view of another exemplary embodiment of a display device according to the invention. FIG. 14 is a perspective view of an exemplary embodiment of an operation state of the display device of FIG. 13. Referring to FIGS. 13 and 14, the display device according to this exemplary embodiment of the present disclosure is different from that of FIG. 1 in that the former further includes a display window PW disposed or formed in an upper plate 100 of the housing H.

In an exemplary embodiment, the display window PW may be disposed or formed in the upper plate 100. In an exemplary embodiment of manufacturing a display device, the display window PW may be formed by partially recessing the upper plate 100. The upper plate 100 may be open at the second side of the display device at which the stopper ST is disposed. Accordingly, the display window PW may at least partially expose the cover window W and the display panel PA each disposed inside the housing H.

That is, unlike the display device according to the embodiment of FIG. 1, the display screen of the display device can be seen from outside the display device even in the initial state thereof when the display screen is completely retracted into the housing H. In this case, the size of the display screen in the initial state is different from that in the spread-out state. A size of the display screen in the initial state may be a minimum. Accordingly, by adjusting the size of the display screen as desired, a display device having a variety of applications can be implemented.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A display device comprising:
   a display panel which displays an image with light;
   a cover window disposed on the display panel to form an outer display surface of the display device;
   a housing into which and out from the display panel and the cover window are together moved; and
   within the housing:
      a winding roller around which the display panel is wound and unwound within the housing, a first end of the display panel being connected to the winding roller; and
      a sliding guide along which the cover window slides to be bent within the housing, the sliding guide disposed outside the winding roller.

2. The display device of claim 1, wherein the housing comprises:
   upper and lower plates spaced apart from each other and facing each other; and
   a connecting plate which is curved to connect the upper and lower plates with each other.

3. The display device of claim 2, wherein the cover window bent within the housing disposes a bent portion of the cover window between the connecting plate of the housing and the sliding guide.

4. The display device according to claim 2, wherein within the housing, the sliding guide comprises:
   a bent portion which is curved along the connecting plate of the housing,
   a separator portion connected to a first end of the bent portion, the separator portion extended along the upper plate of the housing to be spaced apart therefrom, and
   a flat portion connected to a second end of the bent portion opposite to the first end thereof, the flat portion extended along the lower plate of the housing to be spaced apart therefrom.

5. The display device of claim 4, wherein within the housing, a first end of the cover window slides along the sliding guide to be bent within the housing, the bent first end being accommodated between the flat portion of the sliding guide and the lower plate of the housing.

6. The display device of claim 5, further comprising a stopper to which a distal end of the cover window opposite to the first end thereof and a distal end of the display panel opposite to the first end thereof are connected aligned with each other, the stopper disposed outside the housing to restrict movement of the distal ends into the housing.

7. The display device of claim 2, wherein
   the upper plate of the housing defines a display window which exposes an inner area of the housing, and
   the cover window completely moved into the housing together with the display panel, is exposed to outside the housing by the display window of the upper plate.

8. The display device of claim 1, further comprising an adhesive layer attaching the cover window to the display panel, the adhesive layer extended from a distal end of the display panel opposite to the first end thereof to terminate between the distal end of the display panel and the sliding guide.

9. The display device of claim 1, further comprising an adhesive layer attaching the cover window to the display panel, the adhesive layer extended from the first end of the display panel to terminate at a distal end thereof opposite to the first end.

10. The display device of claim 1, wherein the display panel and the cover window together move into or out of the housing along a first direction,
    further comprising an attachment member attaching the cover window to the display panel, the attachment member comprising:
       a first magnet and a second magnet respectively attached to the cover window at opposing sides of the cover window in a second direction crossing the first direction; and
       a first opposing body and a second opposing body attached to the display panel to face the first and second magnets, respectively, the first and second opposing bodies magnetically attractable to the first and second magnets.

11. The display device of claim 1, wherein
    within the housing, the display panel comprises a flexible printed circuit board disposed at the first end of the display panel,
    the winding roller comprises a groove into which the flexible printed circuit board is inserted to be accommodated in an inner space of the winding roller.

12. The display device of claim 1, wherein the display panel comprises:

a first elastic layer and a second elastic layer which is disposed closer to the cover window than the first elastic layer;

a display substrate disposed between the first elastic layer and the second elastic layer, the display substrate generating the image with the light; and a polarizing layer disposed between the display substrate and the second elastic layer.

13. A display device comprising:

a housing in which a winding roller and a sliding guide which is outside the winding roller are disposed;

a display panel which displays an image with light, a first end of the display panel fixed to the winding roller; and a cover window disposed on the display panel to form an outer display surface of the display device, a first end of the cover window disposed outside the sliding guide to be supported thereby, wherein rotation of the winding roller fixed to the first end of the display panel:

moves the display panel into and out of the housing, and slides the cover window along the sliding guide.

14. The display device of claim 13, wherein the display panel and the cover window are attached together at a fixed attached area having a constant planar area, the display panel and the cover window are removably attached together at a variable attached area having a variable planar area, the display panel maximally accommodated in the housing defines the variable planar area equal to zero, and the display panel maximally protruded out of the housing defines the variable planar area as a maximum area.

15. The display device of claim 14, wherein rotation of the winding roller fixed to the first end of the display panel slides the first end of the cover window along the sliding guide at the same time the first end of the display panel is wound around the winding roller.

16. The display device of claim 14, further comprising an adhesive layer attaching the cover window to the display panel, the adhesive layer disposed only in the fixed attached area.

17. A method of changing a display screen size of a display device, the method comprising:

attaching a display panel of a display screen to a winding roller within a housing of the display device, wherein the display displays an image with light;

attaching a cover window to the display panel, the cover window forming an outer display surface of the display screen; and rotating the winding roller attached to the display panel to move the cover window together with the display panel, into and out of the housing, to vary an area of the cover window exposed outside the housing and change a size of the display screen.

18. The method of claim 17, wherein with reference to a rotation axis of the winding roller, the rotating the winding roller to move the cover window together with the display panel comprises:

bending the display panel at a first curvature radius within the housing, and bending the cover window at a second curvature radius within the housing, the second curvature radius being larger than the first curvature radius.

19. The method of claim 17, wherein the moving the cover window together with the display panel, into the housing, decreases an area of the display panel which contacts the cover window, and the moving the cover window together with the display panel, out of the housing, increases the area of the display panel which contacts the cover window.

* * * * *